United States Patent
Brasseur et al.

(10) Patent No.: US 8,318,244 B2
(45) Date of Patent: Nov. 27, 2012

(54) USE OF GLASSY SILICONE-BASED HARD COATING AS RELEASE COATINGS FOR PRINTABLE ELECTRONICS

(75) Inventors: Michael Brasseur, Saginaw, MI (US); Karen Hueston, Midland, MI (US); James Tonge, Sanford, MI (US)

(73) Assignee: Dow Corning Corporation, Midland, MI (US)

( * ) Notice: Subject to any disclaimer, the term of this patent is extended or adjusted under 35 U.S.C. 154(b) by 205 days.

(21) Appl. No.: 12/811,772

(22) PCT Filed: Dec. 18, 2008

(86) PCT No.: PCT/US2008/087304
§ 371 (c)(1),
(2), (4) Date: Jul. 6, 2010

(87) PCT Pub. No.: WO2009/099484
PCT Pub. Date: Aug. 13, 2009

(65) Prior Publication Data
US 2010/0285233 A1 Nov. 11, 2010

Related U.S. Application Data

(60) Provisional application No. 61/024,572, filed on Jan. 30, 2008.

(51) Int. Cl.
*B05D 1/38* (2006.01)
(52) U.S. Cl. ........ 427/146; 427/147; 427/152; 427/256; 427/258; 427/270; 427/271; 427/272; 427/279; 427/282; 427/387

(58) Field of Classification Search .................. None
See application file for complete search history.

(56) References Cited

U.S. PATENT DOCUMENTS

| | | | |
|---|---|---|---|
| 3,986,997 | A | 10/1976 | Clark |
| 4,027,073 | A | 5/1977 | Clark |
| 5,856,030 | A | 1/1999 | Burrows |
| 2005/0238871 | A1 | 10/2005 | Robinson et al. |
| 2006/0058487 | A1* | 3/2006 | Rantala et al. .............. 528/33 |

FOREIGN PATENT DOCUMENTS

| | | |
|---|---|---|
| EP | 0144167 | 6/1985 |
| JP | 2001-260549 | 9/2001 |
| WO | 9634739 | 11/1996 |
| WO | 2007040870 | 4/2007 |

OTHER PUBLICATIONS

Processing Guide for DuPont Luxprint(R) Electroluminescent Inks, DuPont of Wilmington, Delaware, USA, Jun. 2006.
Hueston, et al., Screen Printable UV Curing Electronic Inks. Presented at Radtech International UV and EB Curing Technology Expo & Conference 2008, May 4-7.

* cited by examiner

*Primary Examiner* — Erma Cameron
(74) *Attorney, Agent, or Firm* — Erika Takeuchi

(57) ABSTRACT

A method for fabricating electronic devices includes the steps of 1) printing a multi-layer electronic device on a silicone-based hard coating on a substrate, and 2) removing the device from the substrate. The silicone-based hard coating is an abrasion resistant coating with hardness ranging from 1 to 10 gigaPascals.

6 Claims, 10 Drawing Sheets

USE OF GLASSY SILICONE-BASED HARD COATING AS RELEASE COATINGS FOR PRINTABLE ELECTRONICS

CROSS REFERENCE TO RELATED APPLICATIONS

This application is a U.S. national stage filing under 35 U.S.C. §371 of PCT Application No. PCT/US08/87304 filed on 18 Dec. 2008, currently pending, which claims the benefit of U.S. Provisional Patent Application No. 61/024,572 filed 30 Jan. 2008 under 35 U.S.C. §119 (e). PCT Application No. PCT/US08/87304 and U.S. Provisional Patent Application No. 61/024,572 are hereby incorporated by reference.

STATEMENT REGARDING FEDERALLY SPONSORED RESEARCH

None.

BACKGROUND OF THE INVENTION

Conventional silicone release coating typically include a soft elastomeric silicone made up of lightly crosslinked polydimethylsiloxane (PDMS) polymers. The manufacture of the precursors to such systems is based on a re-equilibration of linear and cyclic species. While such systems are usually stripped to remove low molecular weight materials, fugitive PDMS fluids may still exist with these coatings, either due to the non-volatility of these fluids under manufacturing conditions, or through incomplete gel/network formation under high speed cure conditions. Such fluids under the right conditions and concentration will spontaneously spread due to their very low surface tension.

In many pressure sensitive applications the subsequent adhesion of a tape or label after it has been in contact with a release coating is used to test the impact of fugitive fluid transfer to the adhesive. Problems occur when fugitive PDMS fluids transfer to the tape or label as the weak boundary layer formed prevents adequate adhesion developing in the final application. For this reason many manufactures of sensitive electronic devices have not used PDMS based release coatings in their manufacturing process to avoid surface contamination.

Glassy silicone-based hard coating are based on sol-gel chemistry entirely or in combination with colloidal particles and typically contain T or Q units. Hence, no fugitive PDMS fluids are available for contamination. These hard coats typically have moduli in the 1-10 GPa range. The drawback to such systems is that they form hard brittle coatings mainly of utility as abrasion resistant coatings; to which PSA labels and tapes will adhere. These hard coats are not suitable for high speed release of conventional pressure sensitive adhesives found in the label and tape industry.

Conventional release coatings are designed for easy release not printability. Where free-standing electronic devices need to be printed, the surface properties of the release coating put severe demands on the ink formulation. For example, elastomeric polydimethylsiloxane (PDMS) release coatings are highly effective at releasing printed adhesives, coatings, and inks. Their low surface tension makes printing directly on to these substrates difficult without encountering de-wetting; this often manifesting as craters. Using surfactants and additives to solve these problems can create new problems; e.g., intercoat adhesion problems in multilayer construction. It would be highly desirable to have a flexible substrate commensurate with a high speed printing process that allows good print definition of electronic devices and easy release without excessive use of formulation aids. A printer friendly release coating is highly desirable.

There is also the possibility of contamination of the printed device by liquid gel-fractions or fugitive PDMS fluids as residue from the production and cure of the release coating. Printing on low surface energy release coatings is possible if the inks are correctly formulated with surfactant and additives. However, these additives tend to cause problems in multilayer constructions; as described above they tend to give intercoat adhesion problems, and they also tend to be profoamers causing macro-foam and micro-foam. It would be desirable to have a flexible substrate commensurate with high speed printing process that allowed good print definition and easy release without excessive use of formulation additives.

The low surface energy of soft conventional pressure sensitive release coatings cause conventional epoxy and acrylate based inks to dewet rapidly due to their higher surface tension. This dewetting occurs rapidly leading to poor film print quality which is replicated on subsequent printing layers. The combination of rigidity and slightly higher surface energy leads to a larger window of printability, without the aid of surface active agents. Surface active agents capable of promoting wetting on low surface energy substrates such as conventional soft elastomeric release coatings have a high incidence of inter coat adhesion problems; the surface active agents bloom to the air surface and are either cured in if they contain appropriate reactive groups or form a liquid low surface tension layer, which can be smudged or transferred by contact, or prevent subsequent adhesion through the weak boundary layer formed all of which compromise the final device quality or function.

BRIEF SUMMARY OF THE INVENTION

A silicone-based hard coating on a flexible substrate provides an ink friendly surface for the deposition and removal of printable electronic devices. The silicone-based hard coating may release UV or thermal cured inks used in the printable electronics industry. The silicone-based hard coating releases the valuable electronic device applied thereto by techniques such as roll to roll, rotogravure, flexo-, ink jet, and screen printing techniques, resulting in free standing devices. The silicone-based hard coating has a high enough surface energy to allow printability without complex mixtures of additives such as wetting agents, thixotropes, and defoamers, but the silicone-based hard coating does not allow adhesion to develop to an extent that the devices are compromised or damaged when they are removed.

DETAILED DESCRIPTION OF THE INVENTION

A silicone-based hard coating may be used on a flexible substrate as an ink friendly surface for the deposition and removal of printable electronic devices. This hard coat may have a hardness ranging from 1 GPa to 10 GPa. The silicone-based hard coating will release UV or thermal cured inks used in the printable electronics industry. This silicone-based hard coating releases the valuable electronic device applied to it by conventional application techniques such as roll to roll, rotogravure, flexo-, ink jet, or screen printing techniques, resulting in free standing devices. These devices can then be removed from the silicone-based hard coating and applied to a wider range of final substrates. Alternatively, the silicone-based hard coating allows the application of devices to finished articles, including but not limited to, garments, bags, and helmets, which are not commensurate with high speed printing lines.

Figure 1:
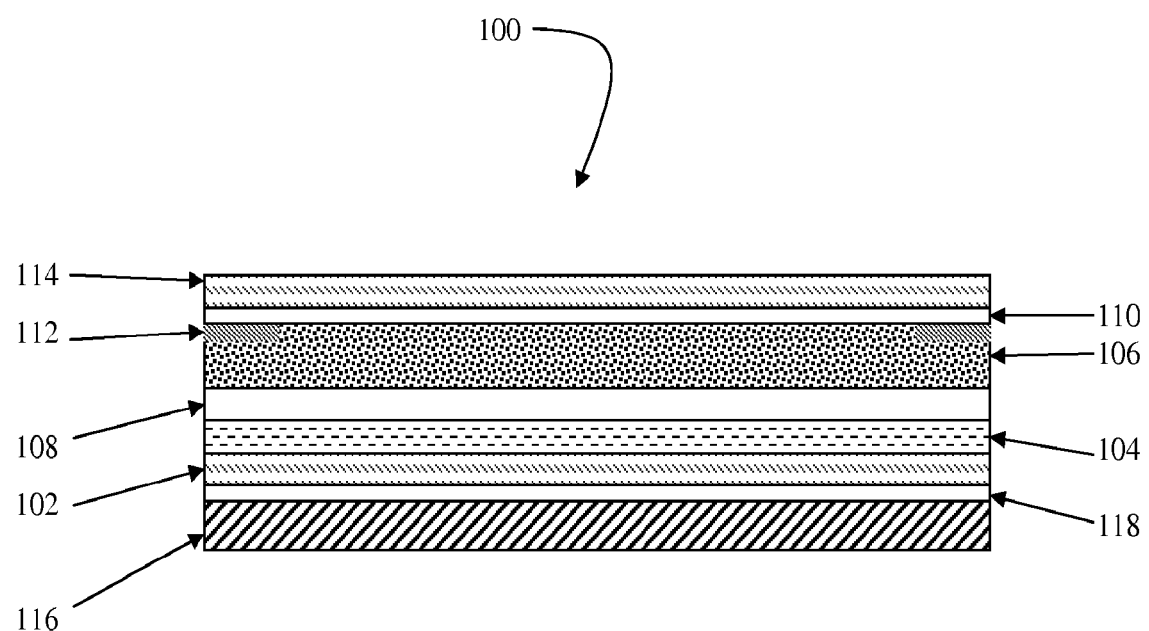
FIG. 1 is a partial cross section of an exemplary EL lamp 100.

The silicone-based hard coatings described herein have a high enough surface energy to allow printability without complex mixtures of wetting agents, thixotropes, and defoamers. However, the silicone-based hard coatings do not allow adhesion to develop to an extent that the device are compromised or damaged when they are ready to be removed. Without wishing to be bound by theory, it is thought that the ability to print quality films without wetting agents, thixotropes, and defoamers in the ink layer(s) results in a wider latitude of design in subsequent ink layers.

The silicone-based hard coating may consist essentially of a siloxane resin and colloidal silica. The siloxane resin may comprise units of the formula $RSiO_{3/2}$, where each R represents a monovalent organic group. For purposes of describing the silicone-based hard coating herein, the transitional phrase "consist essentially of" limits the scope of the silicone-based hard coating to the specified silicon resin and colloidal silica and additional ingredients that do not materially affect the printability, surface energy, and adhesion characteristics of the silicone-based hard coating. Examples of suitable groups for R include substituted and unsubstituted monovalent hydrocarbon groups. Unsubstituted monovalent hydrocarbon groups include as alkyl groups exemplified by methyl, ethyl, propyl, and butyl, alternatively methyl; and alkenyl such as vinyl. Substituted monovalent hydrocarbon groups include halogenated hydrocarbon groups such as 3,3,3-trifluoropropyl; and organofunctional hydrocarbon groups such as gamma-glycidoxypropyl and gamma-methacryloxypropyl. Alternatively, at least 70% of the R groups may be methyl. The silicone-based hard coating may comprise up to 70% of siloxane resin, based on the weight of the composition. The silicone-based hard coating may comprise up to 30% of colloidal silica, based on the weight of the composition. Alternatively, the silicone-based hard coating may be a silsesquioxane resin, such as a methyl silsesquioxane resin. Silicone-based hard coatings and methods for their preparation are known in the art. Examples of suitable silicone-based hard coatings and methods for their preparation are disclosed, for example, in U.S. Pat. No. 4,027,073 and WO1996/034739, which are hereby incorporated by reference. Commercially available abrasion resistant coatings may alternatively be used as the silicone-based hard coating. Suitable abrasion resistant coatings for use as the silicone-based hard coatings are commercially available, for example, as SILVUE® 101, which is available from SDC in Anaheim, Calif., USA. However, the use of these abrasion resistant coatings and other silicone-based hard coatings for release applications is heretofore unknown because in conventional release coating applications, such abrasion resistant coatings have too much adhesion to be useful as a release coating.

Method of Use

This invention relates to a method for fabricating electronic devices comprising:

1) forming a multi-layer electronic device on a silicone-based hard coating on a substrate, where the coating has hardness ranging from 1 to 10 GPa, and 2) removing the device from the substrate. The silicone-based hard coating may be provided on the substrate by any convenient means. For example, one method for forming the silicone-based hard coating involves web coating a solvent solution with a microgravure in a roll to roll process with heating, for example, in an oven to cure a resin composition on the substrate and remove solvent. This method may be used to form a silicone-based hard coating having a thickness ranging from 1 to 5 micrometers. Hardness of the silicone-based hard coating can be measured using a Fischerscope H100 indenter to perform a Vickers hardness test.

Step 1) may be performed by screen printing. The silicone-based hard coating used in step 1) may comprise a silsesquioxane resin, alternatively the silicone-based hard coating may comprise up to 70% by weight of a methyl silsesquioxane resin and up to 30% by weight of a colloidal silica. A UV curable ink may be used to print the device on the substrate. This method is useful in the fabrication of various products, such as keyboards, radio frequency identification (RFID) tags and antennae, cards and novelties, sensors, photovoltaics, display, batteries, capacitors, backplanes, memory and smart cards, signage, sensors, electroluminescent lighting and process and logic devices.

An example of the method of this invention can be used during fabrication of a device such as an elastomeric electroluminescent (EL) lamp as described in U.S. Pat. No. 5,856, 030. A partial cross section of an exemplary EL lamp 100 is depicted in FIG. 1. Lamp 100 includes a base layer 102, an electrode 104, phosphor layer 106, dielectric layer 108, a transparent organic conductor 110, Ag conducting bus bars 112, and a protective overcoat 114. The EL lamp 100 may be constructed on the silicone-based hard coating 116 described above on a substrate 118, such as PET.

Each layer 102, 104, 106, 108, 110, 112, and 114 may be formed by applying a film of a curable composition on the substrate and curing the film. Forming each of these layers 102, 104, 106, 108, 110, 112, and 114 may take as many as 2 to 5 applications (alternatively 4 applications) in step 1) to get the required film thickness for operation.

The base layer 102 may be applied to the silicone-based hard coating on the substrate, as described above, by screen printing. Curing may be performed by exposure to heat and/or UV radiation. Step 1) may be repeated to form each layer 102, 104, 106, 108, 110, 112, and 114 in the EL lamp 100. To achieve good planarity in the EL lamp 100, the silicone-based hard coating may be a heat stabilized silicone coated polyester film, which can compensate for the thermal cure of the organic clear conductor layer 110.

The method may optionally further comprise: 3) applying the device to a different substrate. Step 3) may be performed by, for example, applying an adhesive to the base layer 102 or the protective overcoat 114, and thereafter adhering the electronic device to the different substrate. Suitable substrates include, for example, fabrics.

Inks Useful for Preparing the Electrode

Conductive Ag inks may reduce the power consumption of the EL lamp and result in higher illumination for a given power level. The more highly conducting Ag inks available are typically thermoset systems. Heat facilitates the conducting process by increasing the efficiency of the scouring process, and producing matrix shrinkage, both of which lead to direct metallic Ag—Ag interactions and higher current carrying pathways. To meet the conductivity requirements, the choice of Ag types, loading levels and scouring agents may be optimized to achieve direct particle-particle contact. At the 65-80 wt % of Ag loading used to achieve $\leqq 50$ m$\Omega$square-mil and $\leqq 11$ m$\Omega$square-mil little, or no, UV or visible light penetrates the ink surface. UV radical inks where the degree of cure may dependent on incident UV flux may have a secondary cure mechanism. Cationically cured systems, with their inherent living-cure characteristic, are more suited to this application. The cure is initiated in the surface of the ink, and progresses to full cure with time and/or temperature. A small quotient (<35 wt %) of the Ag ink formulation is available to optimize UV cure, toughness, flexibility, print quality, and adhesion to a variety of substrates. Table 1 gives the class of materials and their role in the Ag UV ink.

TABLE 1

Anatomy of an Ag Ink

| Material | Role |
| --- | --- |
| Cycloaliphatic Epoxy | Crosslinking, toughness, viscosity control |
| Resin | Flexibility and toughness |
| Cationic initiator | Acid generator, cure speed/clarity |
| Photosensitizer | Synergist, cure speed/clarity |
| Additives package | Adhesion, conductivity and print enhancers |
| Ag particles | Conductivity and printability |

Encapsulants

The encapsulant (e.g., made up of base layer 102 and protective overcoat 114) may provide a flexible, optically transparent, moisture barrier that adheres to multiple substrates and can be printed on top of and cured against. Simple aliphatic backbones, such, EDPM, ethylene butylene-copolymer, butadiene, isoprene, or silicones yield the flexibility and moisture requirement suitable for this application. Cationically cured encapsulants with a similar vehicle to the Ag ink described in Table 1 may be used to reduce the number of intermediates and allow a lock and key approach to adhesion. Flexible UV epoxies are derived from hard cycloaliphatic epoxies formulated with flexible diol, triol, and hyperbranched alcohols. Water pick up and tensile property testing were used as a primary screening for suitable vehicles.

Printability

In the elastomeric EL lamp 100, the dielectric layer 108 and phosphor capacitive layer 106 may be supplied as commercially available inks. They both may use the same radically cured vehicle and have excellent printability. The only printable clear conductive inks useful for forming layer 110 are those that utilize organic conducting polymer, PEDOT. The commercial PEDOT materials are thermally cured from an aqueous solution.

Inks for forming the various layers in the EL lamp 100 are known in the art and are commercially available. For example, phosphors such as 8150B or 8150L White Phosphor, 8152B or 8152 L Blue-Green Phosphor and 8154L Yellow-Green phosphor are commercially available from DuPont of Wilmington, Del., USA. Dielectrics include 8153 High K Dielectric Insulator also from Du Pont. Conductors include 9145 Rear Electrode, Silver Conductor (which also may be used for bus bars) and 7162 Front Electrode Translucent Conductor, which are also available from DuPont. Protective Encapsulants are also available as inks, such as 5018 Clear UV Cure Ink also from DuPont.

EXAMPLES

The following examples are included to demonstrate the invention to those of skill in the art. However, those of skill in the art should, in light of the present disclosure, appreciate that many changes can be made in the specific embodiments which are disclosed and still obtain a like or similar result without departing from the spirit and scope of the invention. All percentages are in wt. %, unless otherwise indicated.

Figure 2:
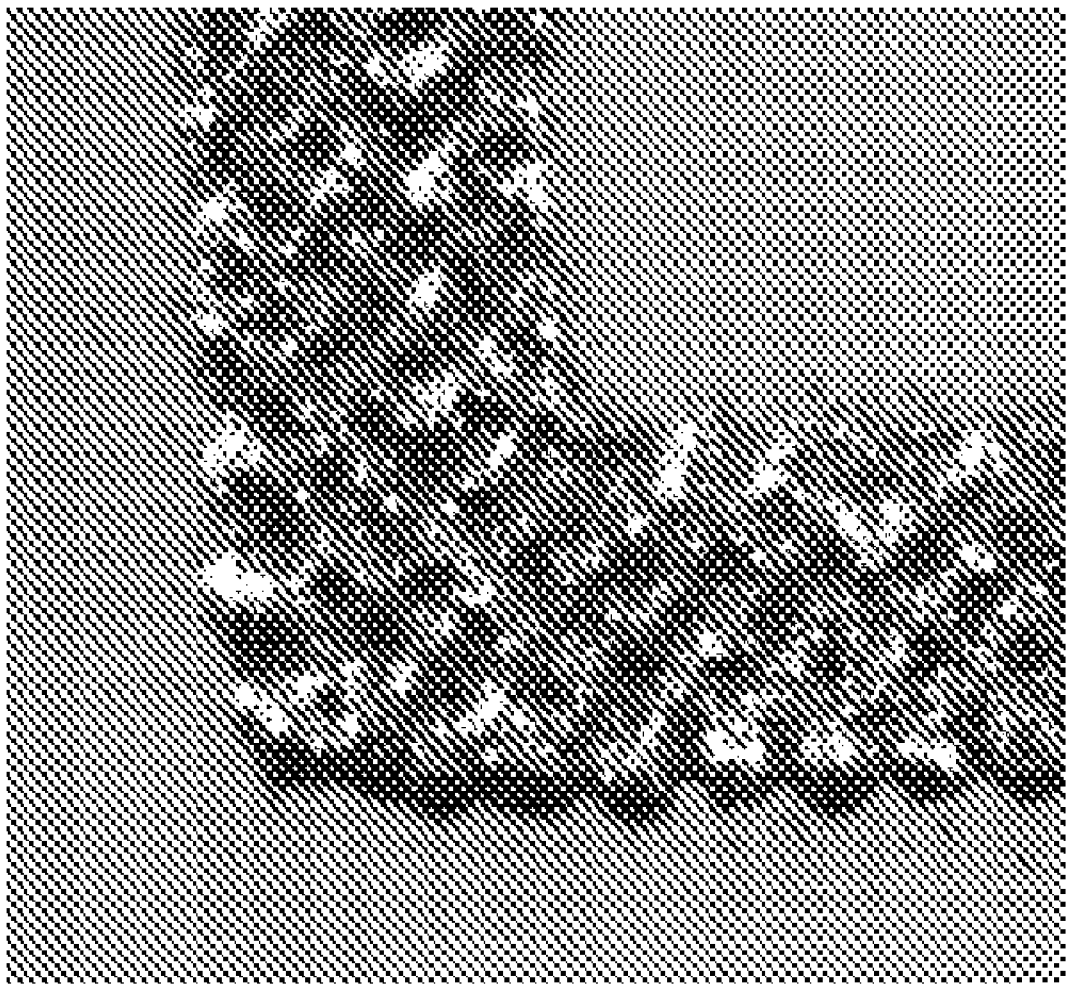
FIG. 2 is a screen print pattern on 230 stainless steel mesh screen.

The ink vehicles comprised cylcoaliphatic epoxies crosslinkers and resins. Masterbatches of resin and crosslinker were created using a Hauschild dental mixer. The final ink formulations were also prepared in a dental mixer. The printability of each Ag ink and encapsulant were evaluated using a Forshlund screen printer. The Ag inks were printed through a 230 mesh stainless steel screen see FIG. 2. The encapsulant was printed using a 150 polyester mesh with a simple rectangular pattern (5.25×3.25 inches). Three printed samples were prepared for each ink. Each sample was printed, cured and printed again to assess printability and intercoat adhesion. Tensile testing was carried out on screen-printed materials.

The electrical properties were measured using a ASTM D390-98 on Ag inks drawn down an FR4 board. The cured film thickness was measured with a digital micrometer. The screen printed and drawn samples were cured by UV using a Fusion UV unit with a H bulb at a belt speed of 50 ft/min. The FR4 board "prints" were sent through the UV source twice and then post cured at 80° C. for at least 1 hour. Once cured, volume and sheet resistivity were measured using the FR4 board samples. The solvent wipe test, ASTM D 5402-93, was also performed on the FR4 board samples.

An Elcometer 1540 cross hatch adhesion tester, used in accordance with ASTM D 3359, was used to assess adhesion. The encapsulants were cured using a single pass (800 mJ/cm$^2$) of a fusion H bulb.

Initial experiments centered on Ag type and vehicle composition. Table 2 shows the physical properties of a series of Ag flakes and powders tested. Table 3 shows the resistivity values obtained for a fixed level of Ag.

TABLE 2

Silver Flake and Powder products tested in Ag Ink

| Silver Material | Tap density (g/cc) | Particle size (95%) | Surface Area ($m^2/g$) |
|---|---|---|---|
| Silver Flake A | 3.0-5.2 | 30 um | 0.30-0.85 |
| Silver Flake B | 2.6-3.6 | 12 um | 0.80-1.20 |
| Silver Flake C | 3.0-4.5 | 12 um | 0.80-1.40 |
| Silver Flake D | 5.1 | 5.18 | 0.83 |
| Silver Flake E | 6.7 | 11.56 | 0.22 |
| Silver Flake F | 3.2-5.7 | 20 um | 0.30-0.75 |
| Silver Flake G | 2.6-3.8 | 12 um | 1.15-1.75 |
| Ag powder H | 5.6 | 5 um | 0.20 |

TABLE 3

Resistivity of Inks Containing One Silver Product

| Silver Material | Resistivity (mΩ/sq-mil) |
|---|---|
| Silver Flake A | 50 |
| Silver Flake B | 124 |
| Silver Flake C | 160 |
| Silver Flake D | 30192 |
| Silver Flake E | 2070 |
| Silver Flake F | 131 |
| Silver Flake G | 226 |
| Ag powder H | 938 |

The Ag flake A was found to give the lowest resistivity at a fixed level. A designed experiment was used to assess the suitablity of resin/epoxy vehicle combinations at a fixed Ag flake A loading. The results of this test are shown in Table 4.

TABLE 4

Impact of matrix on Ag ink properties.

| Run | Solvent Wipe | Volume Resistivity (Ω-cm) | Sheet Resistivity (mΩ/sq-mil) | Thixotropic Index (1/10) | Printability |
|---|---|---|---|---|---|
| 1 | 5 | 28.5 | 148.3 | 5.44 | Good |
| 2 | 4 | 42.4 | 175.1 | 5.52 | Good |
| 3 | 30 | 21.2 | 146.5 | 5.38 | Poor |
| 4 | 52 | 21.7 | 106.4 | 5.47 | Good |
| 5 | 10 | 18.8 | 103.5 | 4.49 | Good |
| 6 | 29 | 10.4 | 45.4 | 5.91 | Good |
| 7 | 110 | 8.09 | 46.3 | 4.59 | Good |
| 8 | 105 | 9.38 | 66.2 | 4.96 | Good |
| 9 | 55 | 7.84 | 42.1 | 5.15 | Good |
| 10 | 39 | 7.79 | 49.4 | 5.09 | Okay |
| 11 | 88 | 9.5 | 59.8 | 5.58 | Good |
| 12 | 100 | 18.1 | 112.7 | 4.90 | Good |
| 13 | 105 | 8.94 | 59.8 | 5.37 | Good |
| 14 | 2 | 152 | 453.1 | 5.68 | Good |
| 15 | 105 | 7.13 | 57 | 5.12 | Good |
| 16 | 100 | 9.54 | 80.1 | 5.33 | Good |
| 17 | 85 | 9.97 | 57.6 | 5.46 | Good |
| 18 | 100 | 8.38 | 59.8 | 5.73 | Good |

It was found that for a fixed level of Ag, the vehicle composition had little impact on volume and sheet resistivity. The greatest corrolation in resistivity came to the level of scouring agent in the vehicle.

Figure 3:
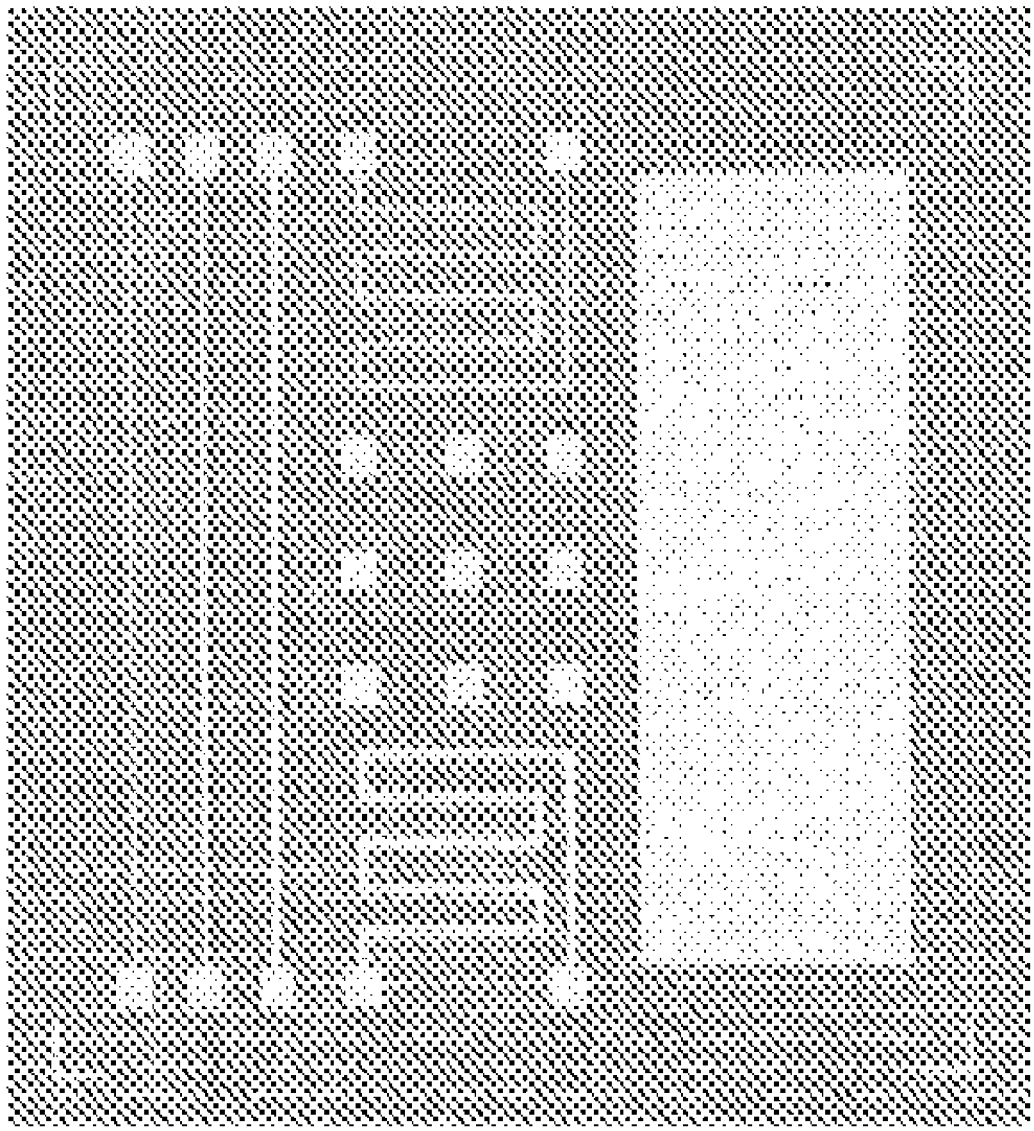
FIG. 3 is Mesh Marks on Cured Ag Ink with 75% Ag.

FIG. 3 illustrates a problem seen in printing thixotropic Ag inks. The screen mesh is retained in the cured Ag trace. The ink fails to flow and level in the 5 to 10 seconds between printing and curing. The large differences in actual film thickness in such cases leads to poor reproducibility in resistance measurements. To aid flow out after printing a series of reactive diluents were evaluated; the results are shown in Table 5.

TABLE 5

Additives Evaluated to Lower Thixotropic Index.

| Additives | Amount used | Thixotropic Index | Average Resistivity (mΩ/sq-mil) |
|---|---|---|---|
| Epodil 748 | 1% | 4.9 | 97.3 |
|  | 1.50% | 4.2 | 43.1 |
|  | 2% |  | 50.3 |
|  | 5% | 3.2 | bubbled |
| ViscoByk 4010 | 0.50% | 6.3 | 95 |
|  | 1% | 6.3 | 66.3 |
| Epodil 757 | 1% | 6.4 | 92.9 |
|  | 2% |  | 59.9 |
|  | 3% |  | 95.9 |
| Epodil 746 | 1% | 5.8 | 92.7 |
|  | 2% |  | 62.3 |
|  | 3% |  | 93.2 |
| Dow Corning DC193 | 0.50% | 7.7 | 80.9 |
|  | 1% |  | 63.7 |
|  | 2% |  | 85.8 |
| Texanol | 1% | 6 | 64.6 |
|  | 2.20% | 4.5 | 86 |

Most of the additives had no, or a detrimental impact of printability, Texanol gave the biggest improvement in printability of the additives tested.

Figure 4:
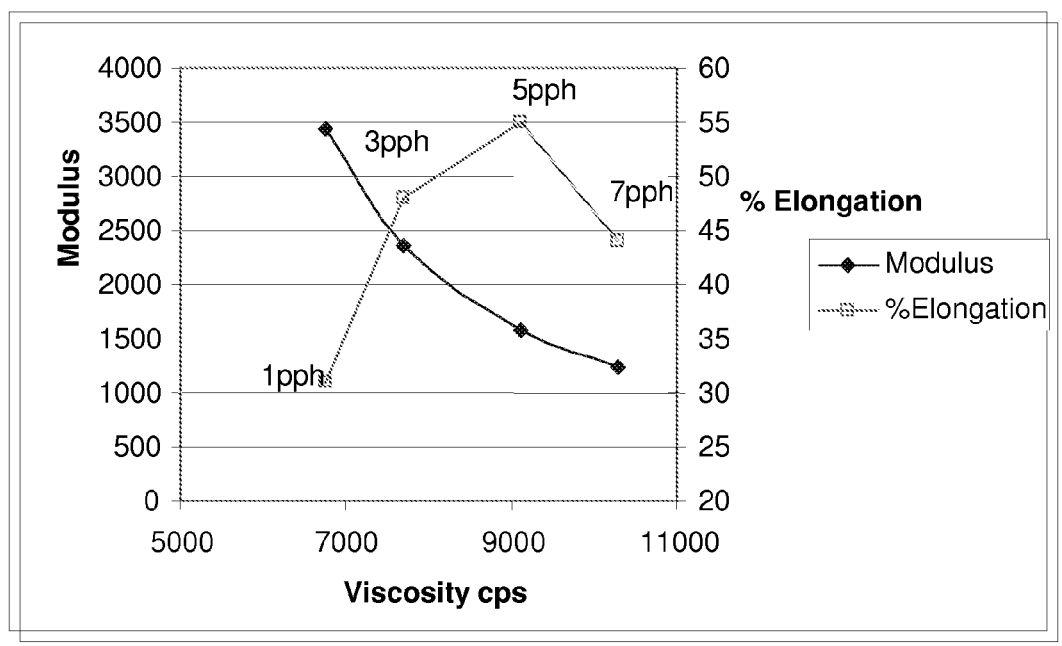
FIG. 4 is a graph of Hardness and % Elongation as a function of viscosity.

The use of polybutadiene-based vehicles gave encapsulants with an excellent combination of water vapor barrier and flexibility suitable for this moisture sensitive EL lamp. High molecular weight resins gave desirable elongation and softness properties on cure, but had poor printability and cure rate. Reducing the ink viscosity and increasing the cure rate can be achieved through increased levels of cycloaliphatics epoxies. As can be seen from FIG. 4, at higher loadings of the cycloaliphatics epoxy crosslinking agent there was an unacceptable decrease in elongation and increase in hardness. If more conventional polyester/ITO (Indium Tin Oxide) EL lamps were being constructed these low viscosity "harder" encapsulants would be acceptable. The lower viscosity eliminated the foaming problem seen in the high resin loading materials, but increased the de-wet between printed layers. Sulfonium and iodonium $SbF_6$ photo acid generators gave adequate cure speeds at the 800 $mJ/cm^2H$ bulb with the chosen vehicle. The iodonium salt was chosen for it lower yellowing of the final lamp. Traditional epoxy trimethoxy silane was used as the adhesion promoter against the inks used in this EL lamp. The first mayor hurdle in the encapsulant development was the printability on release film.

A 5-mil heat stabilized silicone coated polyester film (FRA353) from Burkhardt Freeman was used as the transfer sheet. This sheet had minimal warp during the 100+° C. heat cure cycle necessary for the organic clear conducting ink, and easy release of the finished EL lamp.

There were few UV curable wetting agents for radically cured inks. The hydroxyl end blocked polyether silicone additives used in aqueous paints additives will cure into cationic systems eliminating migration problems sometimes seen with radical non-reactive additives. Byk UV3500 and Dow Corning® DC4-3667, 2-5558, 2-5562 and 2-5211 were found to improve the level of de-wetting on the transfer sheet, but increased the level of defects due to both macro- and micro-foam on printing. To remediate the foaming problem, defoamers were added. The wetting agents and defoamers were both low surface tension >22 dynes/cm, and lower than the surface energy of the cured film. The low surface energy films then caused de-wetting problems on subsequent layers, either of itself, the Ag or capacitive inks, and especially the water based clear conductive layer. The de-wetting was more pronounced as the time between screen-printing and UV cure increased.

Despite exhaustive combinations of wetting agents, thixotropes, and defoamers; a compromise could not be found that gave a consistent, high quality stack of inks necessary for an elastomeric EL lamp. Printing on uncoated polyester films gave acceptable printability when the antagonistic combinations of additives were removed. Reducing the wetting requirements of the substrate yielded larger formulae space. Silicone release coatings are soft elastomeric coatings designed to release pressure sensitive adhesives. The release requirements for UV inks are much lower. A thermal cure release coating, which could receive UV inks without wetting agents, was formulated and coated on a 5 mil polyester film. Table 6 give the physical properties of two low viscosity encapsulant formulations used to show the improvement in printability of the release film. Table 6 gives the physical properties of two low viscosity encapsulant formulations used to show the improvement in printability of the release film.

TABLE 6

Physical properties of encapsulant used for printability studies.

| Name | Function | Encapsulant 1 | Encapsulant 2 |
|---|---|---|---|
| Sartomer polyBd600E | Cationic Polymer | 81.6 | 78.5 |
| Cytec UVA 1500 | Epoxy crosslinker | 14.4 | 17.6 |
| Dow Corning Z6040 | Adhesion Promoter | 0.6 | 0.6 |
| Dow Corning 2-7129 | Photoacid generator | 0.6 | 0.6 |
| Ciba Darocur 1173 | Radical Initiator | 0.6 | 0.6 |
| Sartomer SR285 | Reactive Diluent | 1.2 | 1.2 |
| Emerald Foamblast 20F | Defoamer | 1.0 | 1.0 |

| Brookfield Viscometer | Viscosity cps | |
|---|---|---|
| Spindle speed 0.5 rpm | 9440 | 9440 |
| Spindle speed 1 rpm | 7860 | 7080 |
| Spindle speed 5 rpm | 6120 | 5660 |
| Spindle speed 10 rpm | 6060 | 5580 |

Encapsulant 1 had the higher viscosity and easer to print of the two, the de-wetting was even more pronounced on Encapsulant 2.

Samples were prepared by screen printing a layer of encapsulant on to a substrate and then starting a timer. Screen printing was performed using a screen printer, which is a Forslund Cerment Printer, and the screen was a 150 mesh polyester screen. The substrate according to the method of this invention was a release film comprising 70% methylsiliconate and 30% colloidal silica. For comparative purposes, a commercially available release film was used. This was a heat stabilized polyester film having a flexible silicone release coating on its surface; sold as Autostat through MacDermid of Chicago, Ill., U.S.A.

At the time intervals described, the substrate coated with encapsulant was passed through a Fusion UV curing machine, exposing the encapsulant to UV radiation of 800 mJ/cm2 from a Fusion H bulb. Magnified pictures were taken to measure the extent of dewetting and the number of defects. The magnified pictures were taken with a Diagnostic Instrument Spot camera with a Nikon SMZ-10A microscopic lens set at 0.75. From these photos notice the shape of the edge and size of the dewet spots. For instance, the edge of Encapsulant 2 on FRA-353 at 1 min is noticeably thicker indicating how much the film edge has pulled back on itself.

Figure 5:
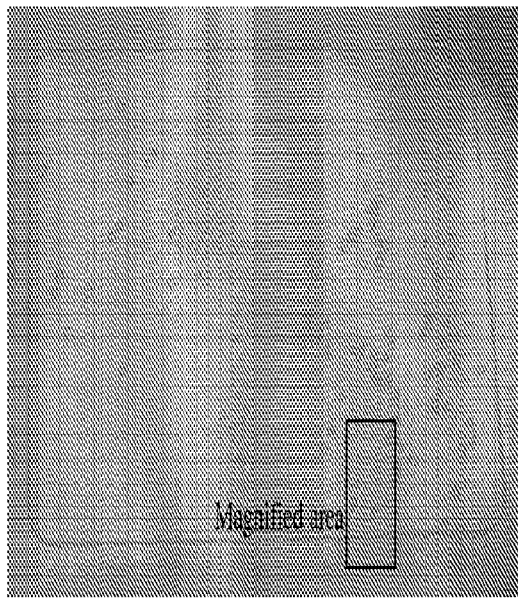
FIG. 5 is a photograph of Encapsulant 2 on comparative film, cured immediately after print.
Figure 6:
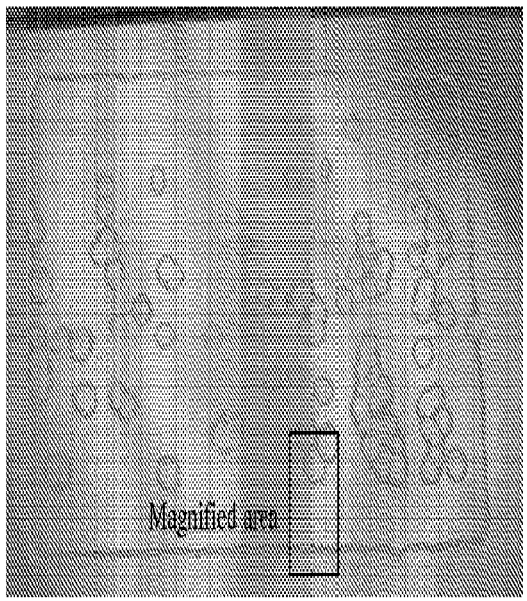
FIG. 6 is a photograph of Encapsulant 2 on comparative film, cured 1 minute after print.
Figure 7:
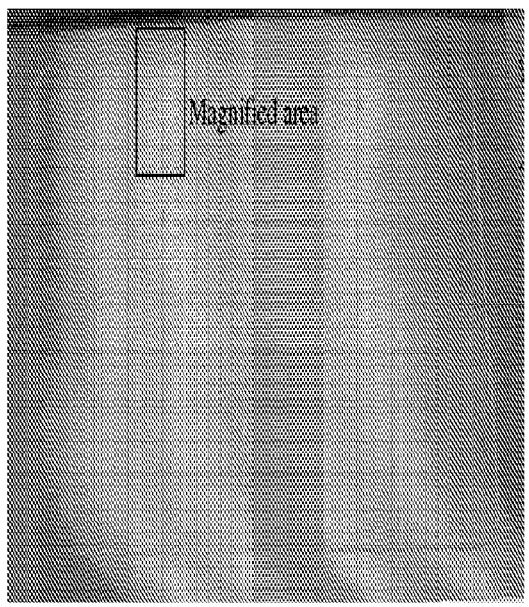
FIG. 7 is a photograph of Encapsulant 2 on release film, cured immediately after print.
Figure 8:
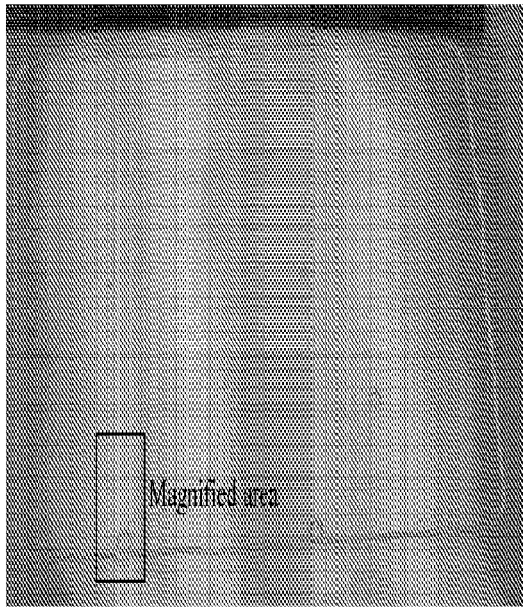
FIG. 8 is a photograph of Encapsulant 2 on release film, cured 1 minute after print.
Figure 9:
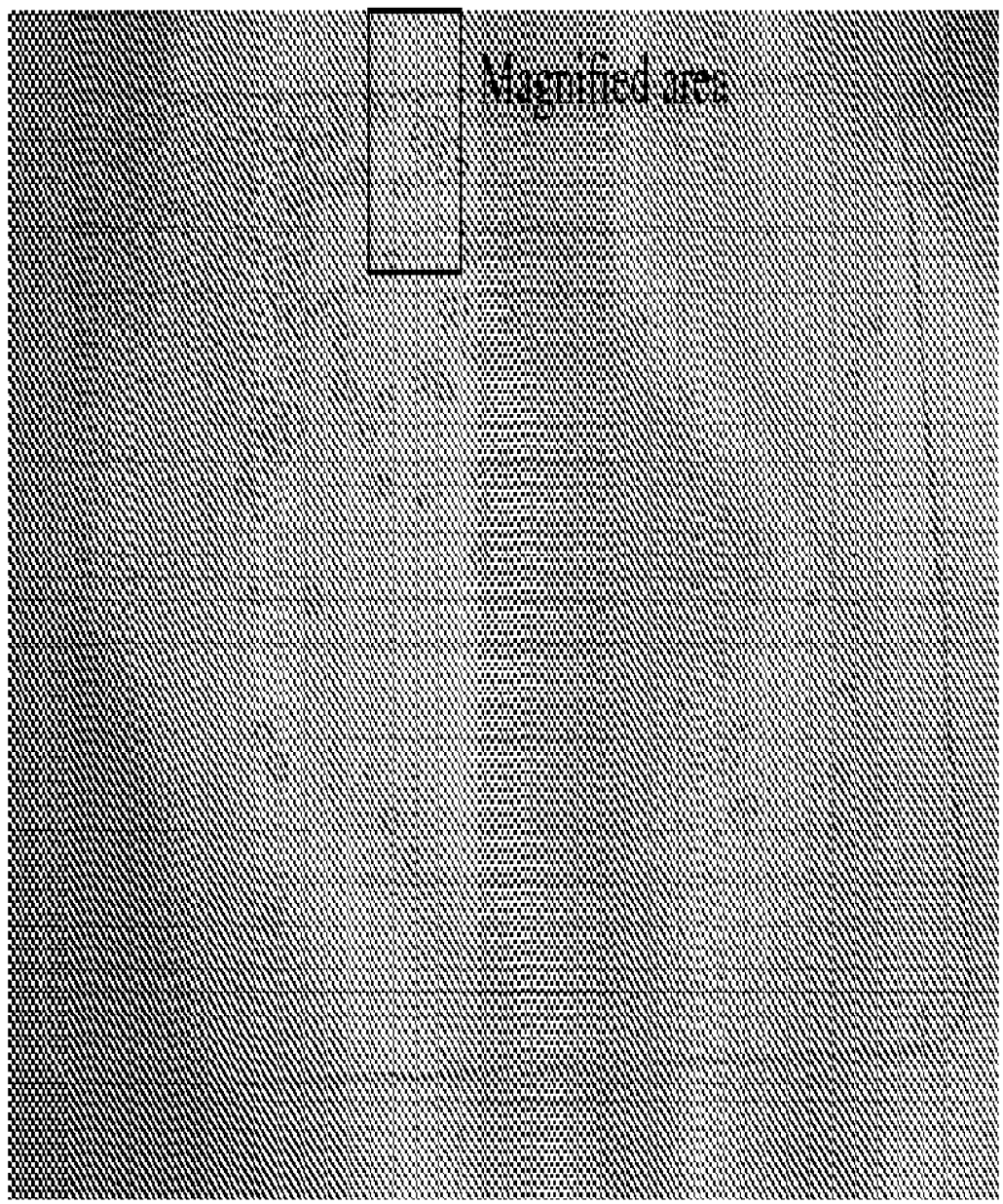
FIG. 9 is a photograph of Encapsulant 1 on comparative film, cured immediately after printing.
Figure 10:
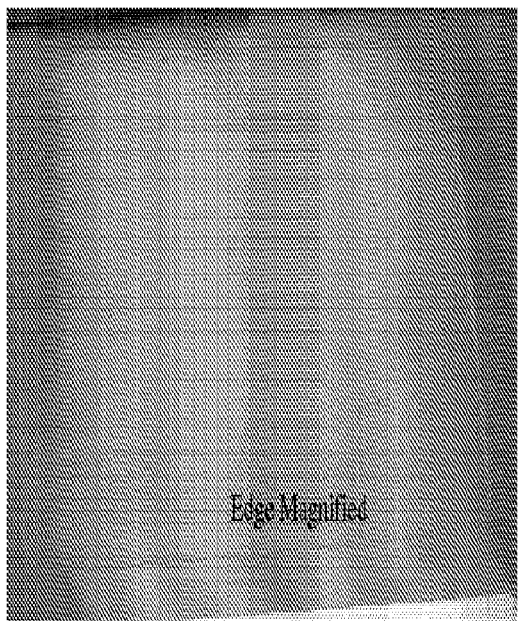
FIG. 10 is a photograph of Encapsulant 1 on release film cured immediately after printing.
Figure 11:
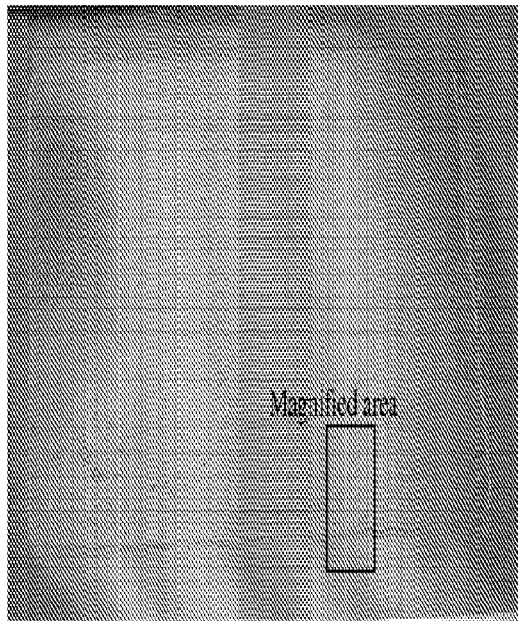
FIG. 11 is a photograph of Encapsulant 1 on release film cured 30 seconds after printing.
Figure 12:
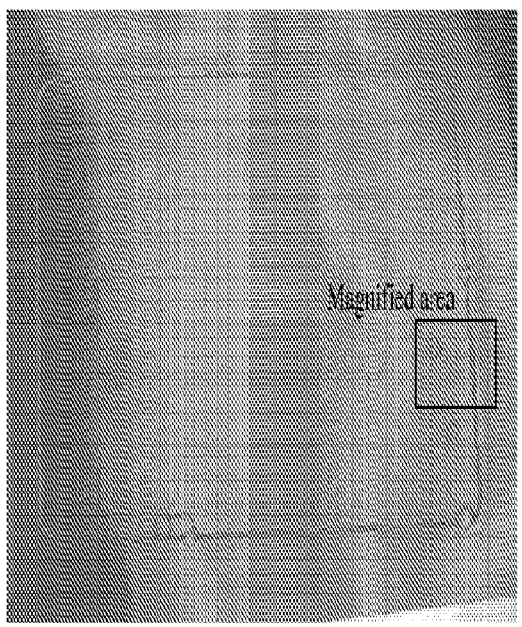
FIG. 12 is a photograph of Encapsulant 1 on release film, cured 60 seconds after printing.
Figure 13:
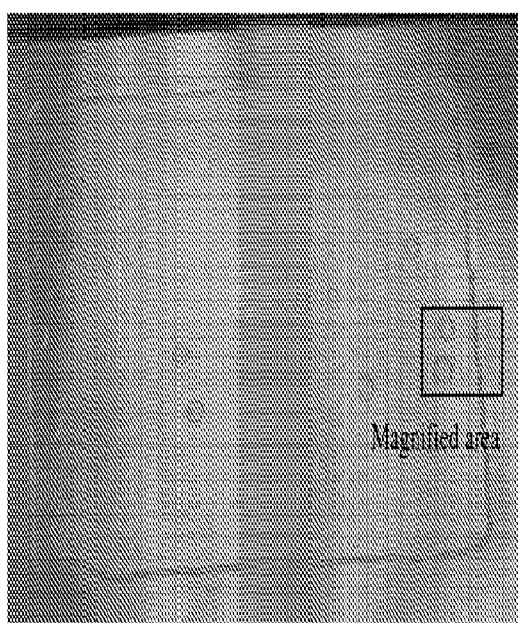
FIG. 13 is a photograph of Encapsulant 1 on release film, cured 90 seconds after print.
Figure 14:
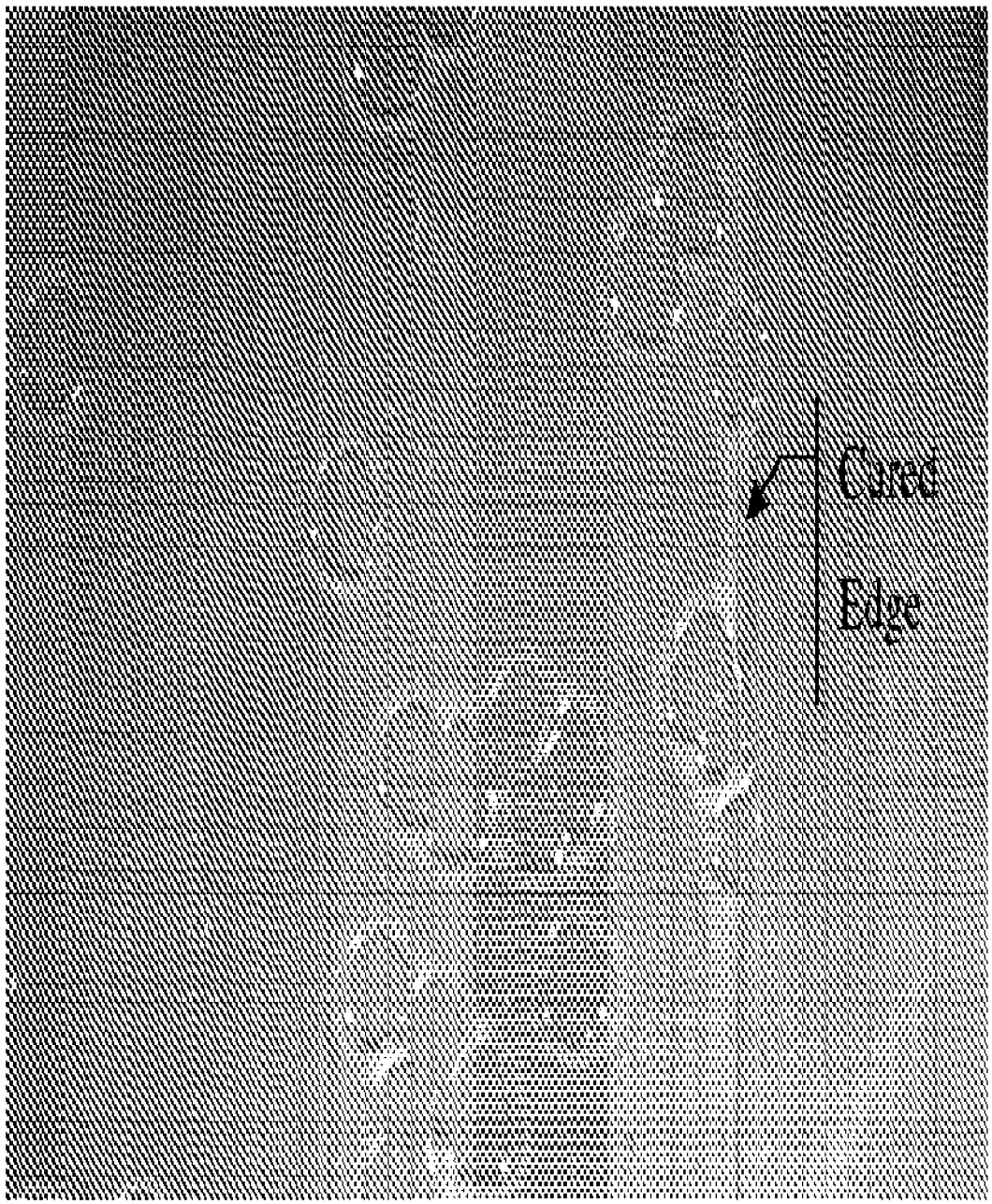
FIG. 14 is a photograph of Encapsulant 1 on comparative film, cured immediate after print.
Figure 15:
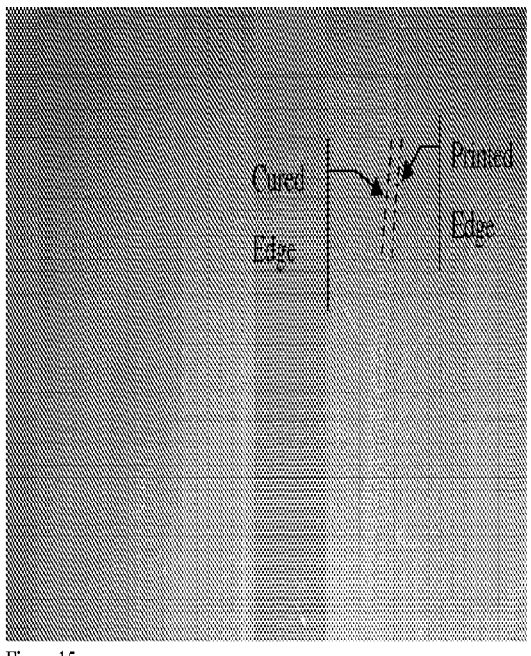
FIG. 15 is a photograph of Encapsulant 1 on release film, cured immediately after print.
Figure 16:
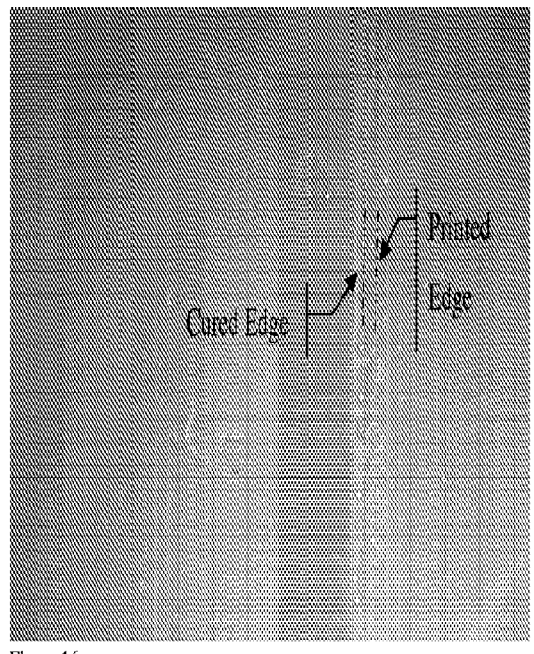
FIG. 16 shows Encapsulant 1 on the substrate of this invention, cured 30 seconds after printing.
Figure 17:
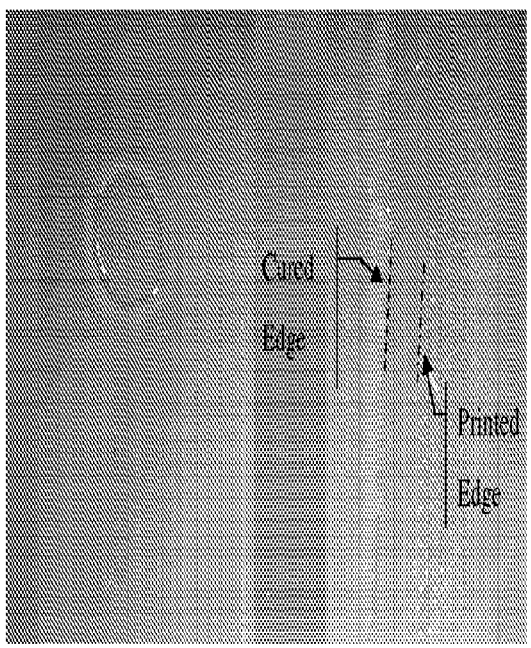
FIG. 17 shows Encapsulant 1 on the substrate of this invention, cured 60 seconds after printing.
Figure 18:
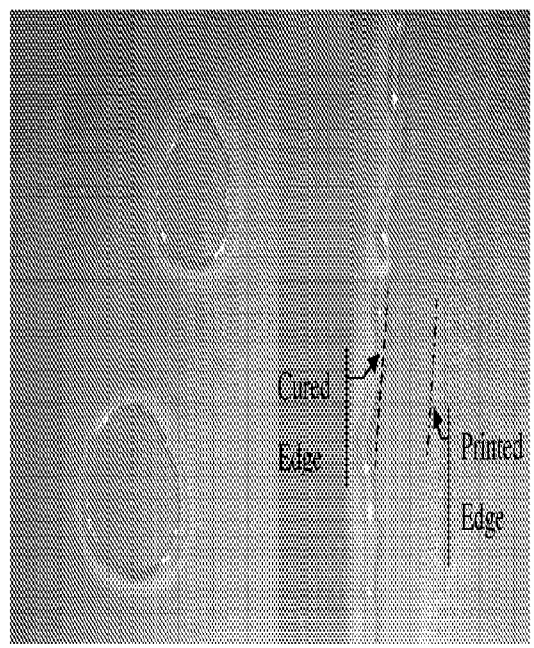
FIG. 18 shows Encapsulant 1 on the substrate of this invention, cured 90 seconds after printing.
Figure 19:
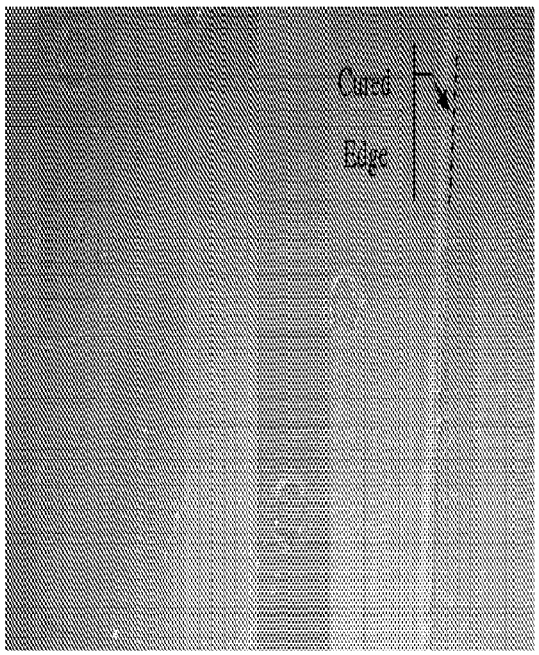
FIG. 19 shows Encapsulant 2 on the comparative substrate, cured immediately after printing.
Figure 20:
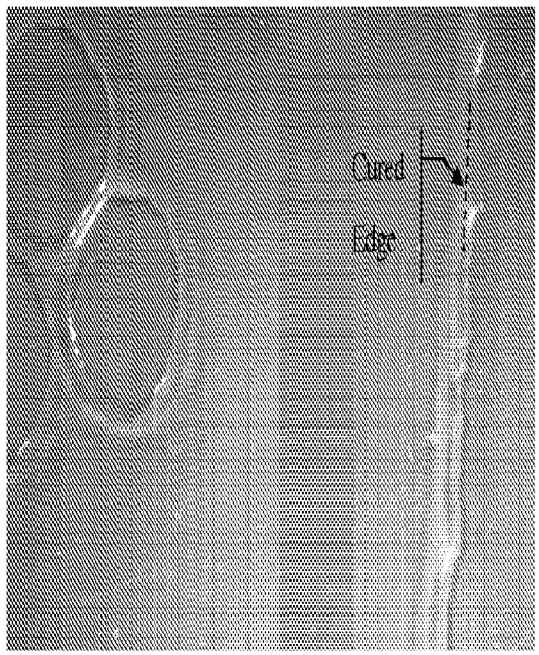
FIG. 20 shows Encapsulant 2 on comparative substrate, cured 1 minute after printing.
Figure 21:
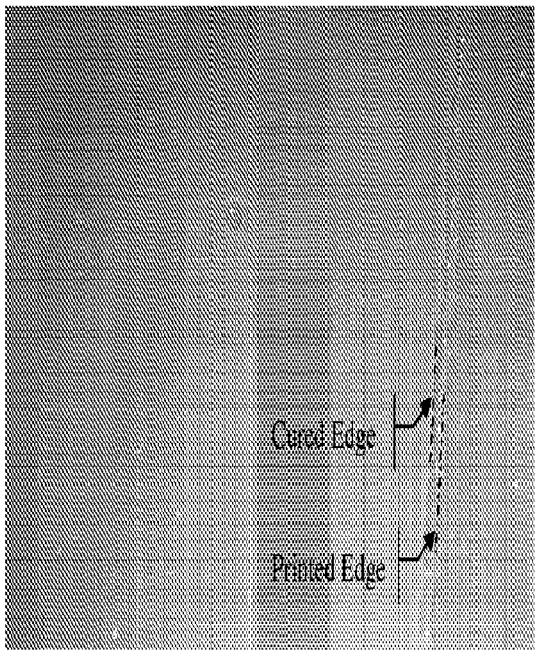
FIG. 21 shows Encapsulant 2 on the substrate of this invention, cured immediately after print.
Figure 22:
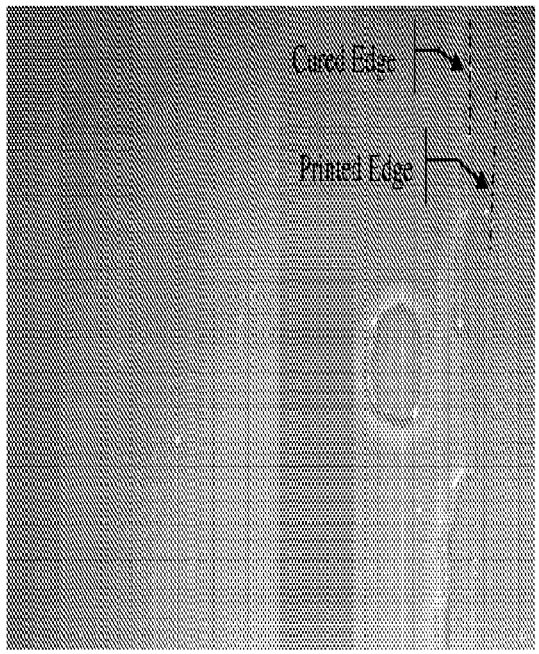
FIG. 22 shows Encapsulant 2 on the substrate of this invention, cured 1 minute after printing.

FIG. 5 shows Encapsulant 2 coated on the comparative substrate immediately after printing. FIG. 6 shows Encapsulant 2 on the comparative substrate 1 minute after printing. FIG. 7 shows Encapsulant 2 on the substrate of this invention immediately after printing. FIG. 8 shows Encapsulant 2 on the substrate of this invention 1 minute after printing. FIG. 9 shows Encapsulant 1 on the comparative substrate, cured immediately after printing. FIG. 10 shows Encapsulant 1 on the substrate of this invention, cured immediately after printing. FIG. 11 shows Encapsulant 1 on the substrate of this invention cured 30 seconds after printing. FIG. 12 shows Encapsulant 1 on the substrate of this invention, cured 60 seconds after printing. FIG. 13 shows Encapsulant 1 on the substrate of this invention, cured 90 seconds after printing. FIG. 14 shows Encapsulant 1 on the comparative substrate, cured immediate after printing. FIG. 15 shows Encapsulant 1 on substrate of this invention, cured immediately after printing. FIG. 16 shows Encapsulant 1 on the substrate of this invention, cured 30 seconds after printing. FIG. 17 shows Encapsulant 1 on the substrate of this invention, cured 60 seconds after printing. FIG. 18 shows Encapsulant 1 on the substrate of this invention, cured 90 seconds after printing. FIG. 19 shows Encapsulant 2 on the comparative substrate, cured immediately after printing. FIG. 20 shows Encapsulant 2 on comparative substrate, cured 1 minute after printing. FIG. 21 shows Encapsulant 2 on the substrate of this invention, cured immediately after print. FIG. 22 shows Encapsulant 2 on the substrate of this invention, cured 1 minute after printing.

Industrial Applicability

The silicone-based hard coating and method described herein may find use in the production of keyboards, RFID tags and antennae, cards and novelties, sensors, photovoltaics, display, batteries, capacitors, backplanes, memory and smart cards, signage, sensors, electroluminescent lighting and process and logic devices.

Without wishing to be bound by theory, it is thought that using the glassy silicone-based hard coating described herein may provide one or more benefits of minimizing contamination by fugitive fluids such as PDMS, low coefficient of thermal expansion to stabilize the film, abrasion resistance on contact surfaces in roll to roll processing, and the use of different ink formulations.

The invention claimed is:

1. A method for fabricating electronic devices comprising the steps of:
   Step 1) printing a layer of a multi-layer electronic device by applying a required thickness film of a curable composition on a silicone-based hard coating on a substrate, where the coating has hardness ranging from 1 to 10 GPa,
   Step 2) curing the film,
   Repeating Step 1) and Step 2) for each layer of the multi-layer electronic device to obtain multi-layer, and
   Step 3) removing the device from the substrate.

2. The method of claim 1, where printing in step 1) is performed by screen printing.

3. The method of claim 1, where the silicone-based hard coating comprises a silsesquioxane resin.

4. The method of claim 1, where the silicone-based hard coating comprises up to 70% by weight of a methyl silsesquioxane resin and up to 30% by weight of a colloidal silica.

5. The method of claim 2, where the curable composition used to print the device on the substrate is a UV curable ink.

6. The method of claim 1, wherein the multi-layer electronic device forms a product selected from: keyboards; RFID (radio frequency identification) tags and antennae; cards and novelties; sensors; photovoltaics; display; batteries; capacitors; backplanes; memory and smart cards; signage; sensors; electroluminescent lighting; and process and logic devices.

* * * * *